US007335262B2

(12) United States Patent
Dwilinski et al.

(10) Patent No.: US 7,335,262 B2
(45) Date of Patent: Feb. 26, 2008

(54) APPARATUS FOR OBTAINING A BULK SINGLE CRYSTAL USING SUPERCRITICAL AMMONIA

(75) Inventors: Robert Dwilinski, Warsaw (PL); Roman Doradzinski, Warsaw (PL); Jerzy Garczynski, Lomianki (PL); Leszek P. Sierzputowski, Union, NJ (US); Yasuo Kanbara, Aman (JP)

(73) Assignees: Ammono Sp. z o.o., Warsaw (PL); Nichia Corporation, Anan-shi (JP)

( * ) Notice: Subject to any disclaimer, the term of this patent is extended or adjusted under 35 U.S.C. 154(b) by 136 days.

(21) Appl. No.: 10/514,639

(22) PCT Filed: Dec. 11, 2002

(86) PCT No.: PCT/JP02/12956
§ 371 (c)(1),
(2), (4) Date: Aug. 30, 2005

(87) PCT Pub. No.: WO03/097906
PCT Pub. Date: Nov. 27, 2003

(65) Prior Publication Data
US 2006/0191472 A1 Aug. 31, 2006

(30) Foreign Application Priority Data
May 17, 2002 (JP) .............................. 2002-143449

(51) Int. Cl.
C30B 35/00 (2006.01)
(52) U.S. Cl. ................... 117/206; 117/200; 117/205; 422/245.1
(58) Field of Classification Search ............. 422/245.1; 117/200, 205, 206
See application file for complete search history.

(56) References Cited
U.S. PATENT DOCUMENTS
5,096,860 A 3/1992 Nadkarni
(Continued)

FOREIGN PATENT DOCUMENTS
CN 1036414 A 10/1989
(Continued)

OTHER PUBLICATIONS
Yamane, H. et al., "Na Flux Growth of GaN Single Crystals" Journal of the Japanese Association for Crystal Growth (JACG), 1998, pp. 14-18, vol. 25, No. 4, NACSIS-Electronic Library Service.
(Continued)

Primary Examiner—Felisa Hiteshew
(74) Attorney, Agent, or Firm—Smith Patent Office

(57) ABSTRACT

An apparatus includes an autoclave for preparing a supercritical solvent, a convection controller for establishing a convection flow, a dissolution zone where a feedstock is located above the convection controller and a crystallization zone where a seed is located below the convection controller are formed. A convection flow rate of the supercritical solution between the dissolution zone and the crystallization zone is determined by the degree of opening of the convection controller and the temperature difference between the dissolution zone and the crystallization zone. Accordingly, the supercritical solution, in which the nitride has a negative temperature coefficient of solubility, is supplied from the dissolution zone to the crystallization zone in which a seed is located through the convection controller so that nitride crystal is selectively grown on the seed by maintaining supersaturation of the supercritical solution with respect to the seed at a raised temperature.

8 Claims, 5 Drawing Sheets

U.S. PATENT DOCUMENTS

| | | | |
|---|---|---|---|
| 5,456,204 | A | 10/1995 | Dimitrov et al. |
| 5,589,153 | A | 12/1996 | Garces et al. |
| 5,679,965 | A | 10/1997 | Schetzina |
| 5,780,876 | A | 7/1998 | Hata |
| 5,868,837 | A | 2/1999 | DiSalvo et al. |
| 5,928,421 | A | 7/1999 | Yuri et al. |
| 6,046,464 | A | 4/2000 | Schetzina |
| 6,051,145 | A | 4/2000 | Griffith et al. |
| 6,067,310 | A | 5/2000 | Hashimoto et al. |
| 6,139,628 | A | 10/2000 | Yuri et al. |
| 6,156,581 | A | 12/2000 | Vaudo et al. |
| 6,172,382 | B1 | 1/2001 | Nagahama et al. |
| 6,177,057 | B1 | 1/2001 | Purdy |
| 6,249,534 | B1 | 6/2001 | Itoh et al. |
| 6,252,261 | B1 | 6/2001 | Usui et al. |
| 6,270,569 | B1 | 8/2001 | Shibata et al. |
| 6,329,215 | B1 | 12/2001 | Porowski et al. |
| 6,372,041 | B1 | 4/2002 | Cho et al. |
| 6,399,500 | B1 | 6/2002 | Porowski et al. |
| 6,399,966 | B1 | 6/2002 | Tsuda et al. |
| 6,423,984 | B1 | 7/2002 | Kato et al. |
| 6,447,604 | B1 | 9/2002 | Flynn et al. |
| 6,459,712 | B2 | 10/2002 | Tanaka et al. |
| 6,468,882 | B2 | 10/2002 | Motoki et al. |
| 6,488,767 | B1 | 12/2002 | Xu et al. |
| 6,509,651 | B1 | 1/2003 | Matsubara et al. |
| 6,586,762 | B2 | 7/2003 | Kozaki |
| 6,593,589 | B1 | 7/2003 | Osinski et al. |
| 6,614,824 | B2 | 9/2003 | Tsuda et al. |
| 6,677,619 | B1 | 1/2004 | Nagahama et al. |
| 6,686,608 | B1 | 2/2004 | Takahira |
| 6,711,191 | B1 | 3/2004 | Kozaki et al. |
| 6,720,586 | B1 | 4/2004 | Kidoguchi et al. |
| 6,858,882 | B2 | 2/2005 | Tsuda et al. |
| 6,924,512 | B2 | 8/2005 | Tsuda et al. |
| 7,081,162 | B2 | 7/2006 | Dwilinski et al. |
| 7,160,388 | B2 | 1/2007 | Dwilinski et al. |
| 2001/0008656 | A1 | 7/2001 | Tischler et al. |
| 2001/0022154 | A1 | 9/2001 | Cho et al. |
| 2002/0014631 | A1 | 2/2002 | Iwata et al. |
| 2002/0031153 | A1 | 3/2002 | Niwa et al. |
| 2002/0047113 | A1 | 4/2002 | Ohno et al. |
| 2002/0063258 | A1 | 5/2002 | Motoki |
| 2002/0078881 | A1 | 6/2002 | Cuomo et al. |
| 2002/0189531 | A1 | 12/2002 | Dwilinski et al. |
| 2003/0143771 | A1 | 7/2003 | Kidoguchi et al. |
| 2004/0031978 | A1 | 2/2004 | D'Everlyn et al. |
| 2004/0139912 | A1 | 7/2004 | Dwilinski et al. |
| 2004/0244680 | A1 | 12/2004 | Dwilinski et al. |
| 2004/0255840 | A1 | 12/2004 | Dwilinski et al. |
| 2006/0032428 | A1 | 2/2006 | Dwilinski et al. |
| 2006/0037530 | A1 | 2/2006 | Dwilinski et al. |

FOREIGN PATENT DOCUMENTS

| | | | |
|---|---|---|---|
| CN | 1289867 | A | 4/2001 |
| CN | 1065289 | | 5/2001 |
| EP | 0 716 457 | A | 6/1996 |
| EP | 0 711 853 | B | 9/1999 |
| EP | 0 949 731 | A | 10/1999 |
| EP | 0 973 207 | A | 1/2000 |
| EP | 1 088 914 | A | 4/2001 |
| FR | 2 796 657 | A | 1/2001 |
| GB | 2 326 160 | A | 12/1998 |
| GB | 2 333 521 | A | 7/1999 |
| JP | 2-137287 | A | 5/1990 |
| JP | 7-22692 | B | 3/1995 |
| JP | 7-165498 | A | 6/1995 |
| JP | 7-249830 | A | 9/1995 |
| JP | 8-250802 | A | 9/1996 |
| JP | 9-134878 | A | 5/1997 |
| JP | 9-293897 | A | 11/1997 |
| JP | 10-7496 | A | 1/1998 |
| JP | 10-70079 | A | 3/1998 |
| JP | 10-70338 | A | 3/1998 |
| JP | 11-54847 | A | 2/1999 |
| JP | 11-307813 | A | 11/1999 |
| JP | 2000-82863 | A | 3/2000 |
| JP | 2000-82867 | A | 3/2000 |
| JP | 2000-216494 | A | 8/2000 |
| JP | 2000-327495 | A | 11/2000 |
| JP | 2001-85737 | A | 3/2001 |
| JP | 2001-342100 | A | 12/2001 |
| JP | 2003-40699 | A | 2/2003 |
| JP | 2004-168656 | A | 6/2004 |
| WO | WO 98/55671 | A | 12/1998 |
| WO | WO 01/24284 | A | 4/2001 |
| WO | WO 01/24921 | A | 4/2001 |
| WO | WO 02/101120 | A | 12/2002 |

OTHER PUBLICATIONS

Yamane, H. et al., "Morphology and Characterization of GaN Single Crystals Grown in a Na Flux", Journal of Crystal Growth, 1998, pp. 8-12, vol. 186, Elsevier Science B. V.

Brandt, O. et al., "Critical Issues for the Growth of High-Quality (Al, Ga)N/GaN and GaN/(In, Ga)N Heterostructures on SiC(0001) by Molecular-Beam Expitaxy", Applied Physics Letters, Dec. 1999, pp. 4019-4021, vol. 75, No. 25, American Institute of Physics.

Waltereit, P. et al., "Nitride Semiconductors Free of Electrostatic Fields for Efficient White Light-Emitting Diodes", Letters to Nature, Aug. 2000, pp. 865-868, vol. 406.

Chu, T. L. et al., "Crystal Growth and Characterization of Gallium Nitride", J. Electrochem. Soc., Solid-State Science and Technology, Jan. 1974, pp. 159-162, vol. 121, No. 1.

Akasaki, I. et al., "Growth and Properties of Single Crystalline GaN Films by Hydride Vapor Phase Epitaxy", Crystal Properties and Preparation, 1991, pp. 154-157, vol. 32-34, Trans Tech Publications, Switzerland.

Kuroda, N. et al., "Precise Control of PN-Junction Profiles for GaN-Based LD Structures Using GaN Substrates with Low Dislocation Densities", Journal of Crystal Growth, 1998, pp. 551-555, vol. 189-190, Elsevier Science B. V.

Kim, S. T. et al., "Preparation and Properties of Free-Standing HVPE Grown GaN Substrates", Journal of Crystal Growth, 1998, pp. 37-42, vol. 194, Elsevier Science B. V.

Kaschner, A. et al., "Influence of Doping on The Lattice Dynamics of Gallium Nitride", MRS Internet J. Nitride Semicond. Res., 1999, 6 pages, No. 4S1, G3.57.

Motoki, K. et al., "Preparation of Large Freestanding GaN Substrates by Hydride Vapor Phase Epitaxy", Jpn. J. Appl. Phys., Feb. 2001, pp. L140-L143, Part 2, No. 2B, The Japan Society of Applied Physics.

S. Hirano et al. "Hydrothermal Synthesis of Gallium Orthophosphate Crystals", Bull. Chem. Soc. Japan., 1989, pp. 275-278, vol. 62, The Chemical Society of Japan.

"Chapter 1 Single Crystal Growth", Hydrothermal Synthesis Handbook, 1997, pp. 245-255, Gihodo Press.

R. A. Laudise, "What is Materials Chemistry?" Materials for Nonlinear Optics, 1991, pp. 411-433, American Chemical Society.

N. Sakagami et al., "Growth Kinetics and Morphology of ZnO Single Crystal Grown under Hydrothermal Conditions", Journal of Ceramic Association, 1974, pp. 405-413, vol. 82, No. 8.

T. Sekiguchi et al., "Hydrothermal Growth of ZnO Single Crystals and Their Optical Characterization", Journal of Crystal Growth, 2000, pp. 72-76, vol. 214/215, Elsevier Science B.V.

K. Yanagisawa et al. "Hydrothermal Single Crystal Growth of Calcite in Ammonium Acetate Solution", Journal of Crystal Growth, 1996, pp. 285-294, vol. 163, Elsevier Science B.V.

K. Yanagisawa et al., "Improvement of Quality of Hydrothermally Grown Calcite Single Crystals", Journal of Crystal Growth, 2001, pp. 440-444, vol. 229, Elsevier Science B.V.

S. Hirano et al. "Growth of Gallium Orthophosphate Single Crystals in Acidic Hydrothermal Solutions", Journal of Materials Science, 1991, pp. 2805-2808, vol. 26, Chapman and Hall Ltd.

K. Pakula, et al. "Growth of GaN Metalorganic Chemical Vapor Deposition Layers on GaN Single Crystals", Acta Physica Polonica A, 1995, pp. 861-864, vol. 88, No. 5.

R. Dwilinski et al., "On GaN Crystallization by Ammonothermal Method", Acta Physica Polonica A, 1996, pp. 763-766, vol. 90, No. 4.

A. Kuramata et al., "Substrate for III-V Group Nitride Semiconductors", Oyo Buturi, 1996, pp. 936-940, vol. 65, No. 9, Japan.

R. Dwilinski et al., "Exciton Photo-Luminescence of GaN Bulk Crystals Grown by the Ammono Method", Materials Science & Engineering B, 1997, pp. 46-49, vol. 50, No. 1-3, Elsevier Science S.A.

C.M. Balkas et al., "Growth of Bulk AlN and GaN Single Crystals by Sublimation", Mat. Res. Soc. Symp. Proc., vol. 449, 1997, pp. 41-46, Materials Research Society.

R. Dwilinski et al., "Ammono Method of GaN and AlN Production", Diamond and Related Materials, 1998, pp. 1348-1350, vol. 7, Elsevier Science S.A.

H. Yamane et al., "Polarity of GaN Single Crystals Prepared with Na Flux", Japanese Journal of Applied Physics, Jun. 1998, pp. 3436-3440, vol. 37, No. 6A, Publication Office Japanese Journal of Applied Physics, Tokyo, Japan.

R. Dwilinski et al., "Ammono Method of BN, AlN and GaN Synthesis and Crystal and Crystal Growth", MRS Internet Journal Nitride Semiconductor Research, 1998, pp. 1-4, vol. 3. No. 25, Retrieved from the Internet: URL:http://nsr.mij.mrs.org/3/25.

Y. Melnik et al., "Properties of Free-Standing GaN Bulk Crystals Grown by HVPE", Mat. Res. Soc. Symp. Proc., vol. 482, 1998, pp. 269-274, Materials Research Society.

S. Porowski, "Bulk and Homoepitaxial GaN-Growth and Characterisation", Journal of Crystal Growth 189/190, 1998, pp. 153-158, Elsevier Science B.V.

M. Yano et al., "Control of Nucleation Site and Growth Orientation of Bulk GaN Crystals", Japanese Journal of Applied Physics, Oct. 1999, pp. L1121-L1123, vol. 38, No. 10A, Part 2, Publication Office Japanese Journal of Applied Physics, Tokyo, Japan.

M. Aoki et al., "Growth of GaN Single Crystals From a Na-Ga Metal at 750° C. and 5MPa of $N_2$", Journal of Crystal Growth, Sep. 2000, pp. 7-12, vol. 218, No. 1, North-Holland Publishing Co., Amsterdam, NL.

Douglas R. Ketchum et al., "Crystal Growth of GLLIUM Nitride in Supercritical Ammonia", Journal of Crystal Growth, 2001, pp. 431-434, vol. 222, Elsevier Science B.V.

O. Oda et al., "GaN Bulk Substrates for GaN Based LEDs and LDS", Physica Status Solidi (a) Applied Research, Mar. 6, 2000, pp. 51-58, vol. 180, No. 1.

I. Grzegory "High Pressure Growth of Bulk GaN from Solutions in Gallium", Journal of Physics Condensed Matter, Jul. 26, 2001, pp. 6875-6892, vol. 13, No. 32, Institute of Physics Publishing.

X. Mao et al. "New Concept Technology Pressure-Variation Liquid Phase Epitaxy" SPIE Photonics Taiwan Conference Proceeding Jul. 2000, pp. 1-12.

M. Palczewska et al. "Paramagnetic Defects in GaN" MRS Internet Journal Nitride Semiconductor Res., 1998, pp. 1-3, vol. 3, No. 45, The Materials Research Society.

Porowski, S., "High Pressure Growth of GaN—New Prospects for Blue Lasers", Journal of Crystal Growth, 1996, pp. 583-589, vol. 166, Elsevier Science B.V.

Penkala, T., "Basics of Crystallography", PWN, 1972, p. 349, Warszawa.

Ikornikova, N., "Hydrothermal Synthesis of Crystals in Chloride Systems", Izd. Nauka, 1975, p. 124 and p. 133, Moscow.

Peters, D., "Ammonothermal Synthesis of Aluminium Nitride", Journal of Crystal Growth, 1990, pp. 411-418, vol. 104, Elsevier Science Publishers B. V., North-Holland.

Sangwal, K., "Elementary Crystal Growth", 1994, p. 331, Lublin.

Purdy, A., "Ammonothermal Synthesis of Cubic Gallium Nitride", Chem. Mater., 1999, pp. 1648-1651, vol. 11, The American Chemical Society.

Lan, Y. et al., "Syntheses and Structure of Nanocrystalline Gallium Nitride Obtained Form Ammonothermal Method Using Lithium Metal as Mineralizator", Material Research Bulletin, 2000, pp. 2325-2330, vol. 35, Elsevier Science Ltd.

APPARATUS FOR OBTAINING A BULK SINGLE CRYSTAL USING SUPERCRITICAL AMMONIA

CROSS REFERENCE TO RELATED APPLICATIONS

This application is the U.S. National Stage Application under 35 USC 371 of International Application No. PCT/JP02/12956, filed on Dec. 11, 2002. The disclosure of International Application No. PCT/JP02/12956 is hereby incorporated by reference.

TECHNICAL FIELD

The present invention relates to an improvement of an apparatus for obtaining a nitride bulk single crystal by crystallizing from supercritical solution on a seed.

BACKGROUND ART

A method of obtaining a nitride bulk single crystal by recrystallizing from supercritical ammonia-containing solution is disclosed in Japanese Patent Application No. 2002-143449. The apparatus for obtaining a nitride bulk single crystal using supercritical ammonia-containing solution comprises an autoclave for preparing supercritical solvent equipped with a convection control means for establishing a convection flow, and mounted inside a furnace unit equipped with a heating device and a cooling device, wherein the furnace unit is controlled to have a predetermined temperature gradient within the autoclave by the heating device and/or cooling device, wherein the convection control means for establishing convection flow comprises at least one horizontal baffle having a central opening and/or a space between the baffle and an inner wall of the autoclave, and separating the dissolution zone where a feedstock is located above the baffle from the crystallization zone where a seed is located below the baffle.

Furthermore, it is found that a convection flow rate of the supercritical solution between the dissolution zone and the crystallization zone may be determined by a degree of opening of the convection control means and a temperature difference between the dissolution zone and crystallization zone etc.

The result of the inventors' research shows that a growth rate of 10 μm/h or more is required for commercially manufacturing of nitride. It is also found to be necessary that nitride is dissolved in the supercritical solvent containing ammonia and at least alkali metal ions to make the supercritical solution, in which the nitride has a negative temperature coefficient of solubility and the supercritical solution is supplied from the dissolution zone to the crystallization zone where a seed is located through the convection control means so that nitride crystal can be selectively grown on the seed arranged in the autoclave by maintaining supersaturation of the supercritical solution with respect to the seed at the predetermined raised temperature and controlling below a certain concentration so as not to allow spontaneous crystallization.

DISCLOSURE OF INVENTION

An object of the present invention is, therefore, to provide an autoclave in which a convection flow rate can be controlled for growing a nitride bulk single crystal.

Another object of the present invention is to provide an autoclave in which contamination by impurities from the autoclave outer wall can be prevented.

Furthermore, the other object of the present invention is to provide an autoclave in which a commercially valuable growth rate can be attained.

These goals can be achieved by the invention based on a technique of an ammono-basic growth of a crystal which comprises a chemical transport in a supercritical ammonia-containing solvent containing at least one mineralizer for imparting an ammono-basic property, to grow a nitride single crystal;

The apparatus comprises an autoclave 1 for preparing supercritical solvent equipped with a convection control means 2 for establishing a convection flow, and mounted inside a furnace unit 4 equipped with a heating device 5 and a cooling device 6, wherein the furnace unit 4 is controlled to maintain a predetermined temperature gradient within the autoclave by the heating device 5 and/or cooling device 6, wherein the convection control means 2 comprises at least one horizontal baffle 12 having a central opening and/or a space between the baffle and an inner wall of the autoclave, and separating the dissolution zone 13 where a feedstock 16 is located above the baffle from the crystallization zone where a seed 17 is located below the baffle, wherein a convection flow rate of the supercritical solution between the dissolution zone 13 and the crystallization zone 14 is determined by a degree of opening of the convection control means 2 and a temperature difference between the dissolution zone 13 and crystallization zone 14, wherein nitride is dissolved in the supercritical solvent containing ammonia and at least alkali metal ions to make the supercritical solution, in which the nitride has a negative temperature coefficient of solubility and the supercritical solution is supplied from the dissolution zone 13 to the crystallization zone 14 in which a seed is located through the convection control means 2, so that nitride crystal is selectively grown on the seed arranged in the autoclave by maintaining supersaturation of the supercritical solution with respect to the seed at the predetermined raised temperature and controlling below a certain concentration so as not to allow spontaneous crystallization.

In the technique of an ammono-basic growth of a crystal, it is found that the crystal growth may be influenced by the composition and concentration of the supercritical ammonia-containing solution, the temperature difference between the dissolution zone and the crystallization zone, the location and area of the baffle by which a convection flow rate is controlled basing on the temperature difference, the filling ratio of ammonia and the ratio of surface area of the seed with respect to that of the feedstock etc. Furthermore, according to the present invention, a convection flow rate of the supercritical solution between dissolution zone 13 and crystallization zone 14 can be determined by the convection control means 2 and the temperature difference, therefore nitride crystal can be selectively grown on the seed by maintaining supersaturation of the supercritical solution with respect to the seed and controlling below a certain concentration so as not to allow spontaneous crystallization.

Moreover, supercritical ammonia-containing solution containing alkali metal ions has an excellent solubility, thereby it is possible to decrease contamination by impurities from the autoclave inner wall if a lining of metal such as Ag, Mo, Fe or Ta, or alloy thereof is applied to an inner wall of the autoclave.

The convection control means is used to create a temperature gradient difference between the dissolution zone and the crystallization zone, and the form and area of the convection control means can be varied by the volume of the autoclave and the ratio of inside diameter to the total length of the autoclave. It is preferable that the convection control means may be formed within the range of 70% to 90% of the inner cross-sectional area of the autoclave and the ratio of opening in baffle may be set at 30% or less. The location of baffle may be adjusted in accordance with the quantity of the grown crystal and the baffle may be located within the range from 1/3 to 2/3 of the total length of the inner autoclave, thereby to adjust the ratio between the dissolution zone and the crystallization zone to a desired value. It is preferable that the feedstock is placed in the dissolution zone and the filling ratio of the feedstock is less than half of the dissolution zone. In case that the feedstock is in the form of gallium metal, the filling ratio of the feedstock may be about 1/4 of the dissolution zone because the volume of the feedstock will be increased by transforming from gallium metal to poly-GaN in the crucible.

In the area of the convection control means 2, it is preferable that the cooling device 6 is arranged for cooling so that it is easier to make a predetermined temperature difference between the dissolution zone 13 and crystallization 14. It is also preferable that the cooling device 18 which can cool the bottom of the flowing area of the crystallization zone is placed in the autoclave and thereby rapid cooling function is executed after crystallization.

Using above constitution of the autoclave, it is possible to improve the growth rate on a seed. It is preferable that the ratio of diameter to total length of the autoclave may be set from 1/15 to 7/15, the ratio of opening in the horizontal baffle on the cross-sectional area may be set at 30% or less and growth rate on a seed may be 10 μm/hr or more.

BEST MODE FOR CARRYING OUT THE INVENTION

Figure 1:
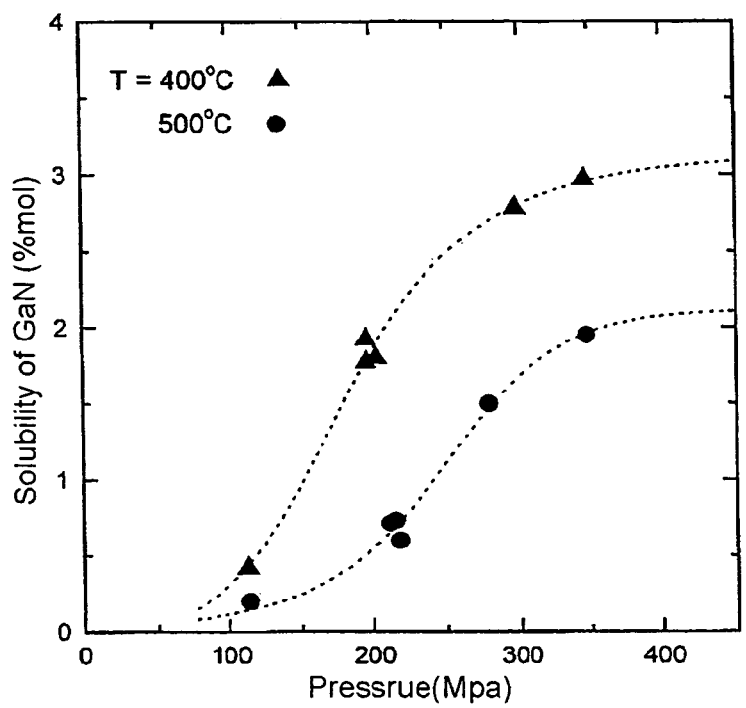
FIG. 1 shows a relation between pressure and GaN solubility in the supercritical ammonia containing potassium amide (at molar ratio of $KNH_2:NH_3=0, 07$) at T=400° C. and T=500° C.

The apparatus for obtaining a bulk single crystal comprises an autoclave 1 for preparing a supercritical solvent equipped with the convection control means 2 for establishing a convection flow, and at least one furnace unit 4 equipped with a heating device 5 and a cooling device 6 on the autoclave. The furnace unit includes a higher temperature zone 14 equipped with a heating device 4, which corresponds to a crystallization zone in the autoclave, and a lower temperature zone 13 equipped with a heating device which corresponds to a dissolution zone in the autoclave. It is also possible to use a furnace unit which includes a higher temperature zone equipped with a heating device and/or cooling device, and a lower temperature zone equipped with a heating device and/or cooling device. The convection control means for establishing a convection flow is composed of at least one horizontal baffle having a central opening and/or a periphery space so as to devide the crystallization zone from the dissolution zone. Thus, the feedstock is set in the dissolution zone, and the seed is set in the crystallization zone, in the autoclave. The convection flow of the supercritical solution between the dissolution zone and the crystallization zone is controlled by the convection control means. The dissolution zone is located above the horizontal baffle, and the crystallization zone is located below the horizontal baffle.

Figure 4:
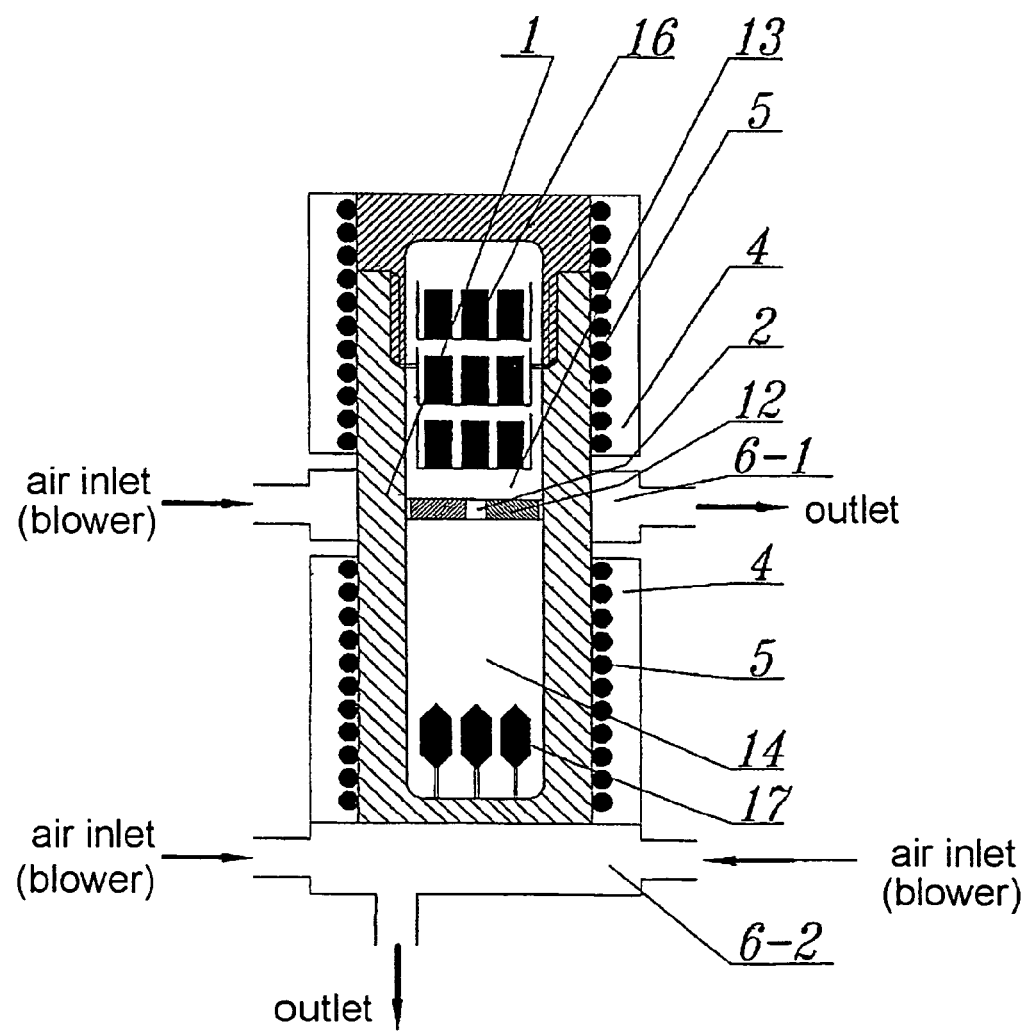
FIG. 4 is a schematic cross-sectional view of an autoclave and a furnace unit used in this invention.
Figure 5:
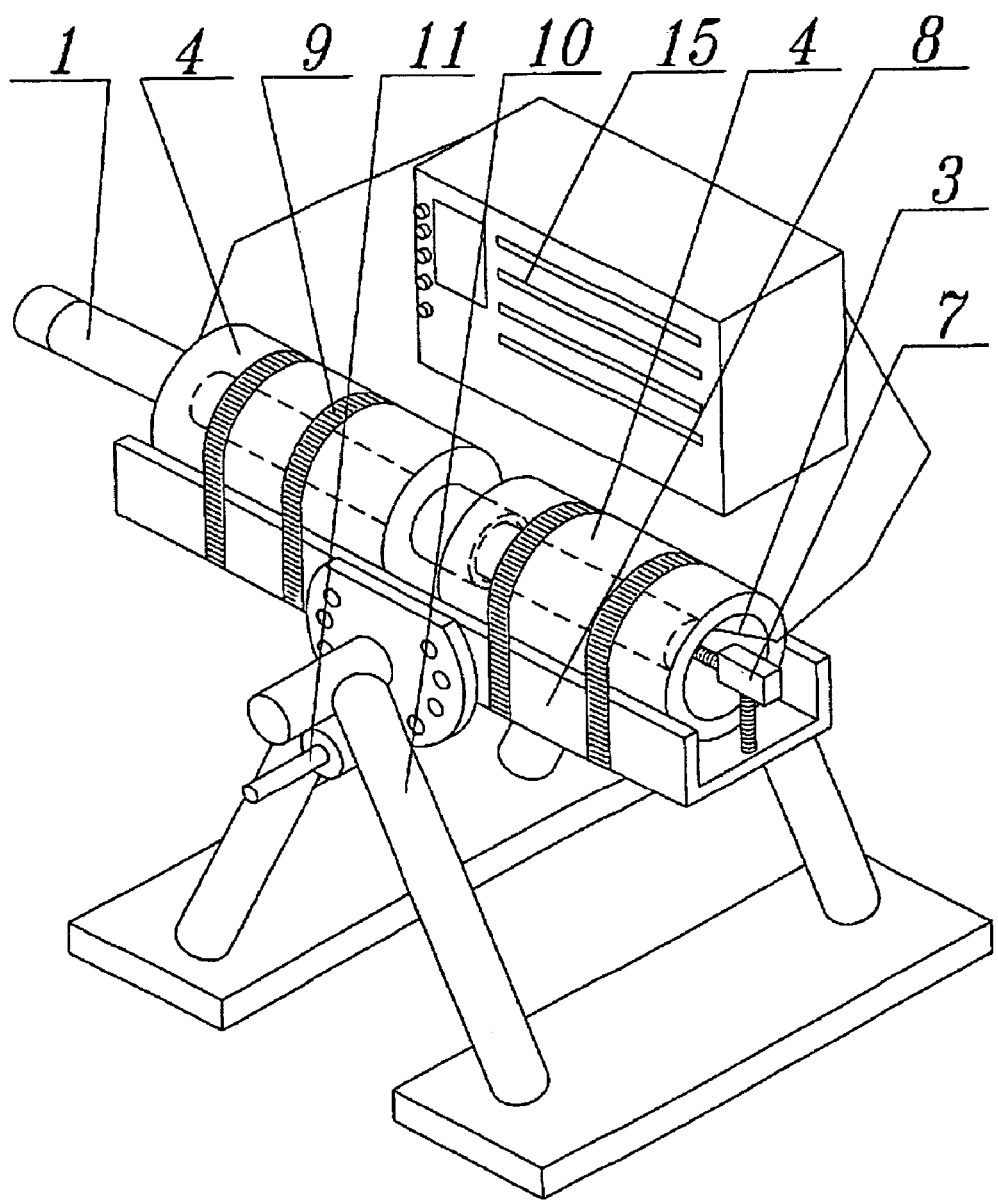
FIG. 5 is a schematic perspective view of an apparatus for obtaining a nitride bulk single crystal.

The apparatus for obtaining a bulk single crystal according to the present invention is illustrated in FIG. 4 and FIG. 5. The main part of the apparatus comprises the autoclave 1 used for preparing a supercritical solvent and the convection control means 2 which enhances chemical transport in the supercritical solution within the autoclave 1. The autoclave 1 is situated in the chamber 3 of the furnace unit 4 (2 sets), equipped with the heating device 5 and the cooling device 6. Position of the autoclave 1 within the furnace unit 4 is secured by a screw blocking device 7. The furnace 4 is embedded in the bed 8 and secured with steel tapes 9 tightly wound around the furnace unit 4 and the bed 8. The bed 8 with the furnace unit 4 is pivotally mounted on the turntable 10 and secured in the desired position by means of a pin securing device 11, so that the convective form and convection flow in the autoclave can be controlled. The convection flow of the supercritical solution in the autoclave 1 placed in the furnace unit 4 is established by means of the convection control means 2, which is composed of the horizontal baffle 12 of a size corresponding to about 70% of horizontal cross-sectional area of the autoclave 1, dividing the crystallization zone from the dissolution zone. The horizontal baffle 12 is located approximately in the middle of the autoclave 1 in terms of longitudinal dimension. Temperature values in each zone of the autoclave 1, falling within the range from 100° C. to 800° C., are controlled by a control unit 15 placed near the furnace unit 4. In the autoclave 1 the dissolution zone 13 corresponding to the lower temperature zone of the furnace unit 4 is situated above the horizontal baffle 12. The feedstock 16 is placed in the dissolution zone 13 and the amount of the feedstock 16 is such that its volume does not exceed ½ of volume of the dissolution zone. Simultaneously, when metallic gallium is introduced as a feedstock in crucible, the total volume of the crucible should not exceed ½ of volume of the dissolution zone. The crystallization zone 14 corresponding to higher temperature zone of the furnace unit 4 is situated below the horizontal baffle 12. In the crystallization zone 14 the seed 17 is located and the specific position in which the seed 17 is placed is below crossing of up-stream convection flow and down-stream convection flow, but still above the bottom of the crystallization zone. The cooling device 6-1 for cooling is placed within the zone of the convection control means 2. As the result, the predetermined temperature difference between the dissolution zone 13 and the crystallization zone 14 may be controlled. At the level of the bottom of the crystallization zone there is another cooling device 6-2, used in order to cool down the zone after the crystallizing process is over, so that the dissolution of the grown crystal during the cooling stage after the crystallizing process can be remarkably prevented.

According to the result of the research, GaN exhibits good solubility in $NH_3$ including alkali metals or their compounds, such as $KNH_2$. The graph in FIG. 1 presents how solubility of GaN in supercritical solvent depends on the pressure, for temperature 400° C. and 500° C. Here the solubility is defined as the molar percentage: $S_m \equiv [GaN^{solution}: (KNH_2+NH_3)] \times 100\%$. In this case, the solvent is the supercritical ammonia-containing solution in which the molar ratio $X \equiv KNH_2: NH_3$ is set at 0.07. Solubility $S_m$ may be a function of three parameters: temperature, pressure, and molar ratio of the mineralizer, i.e. $S_m \equiv S_m (T, p, x)$. Small changes of $\Delta S_m$ can be expressed as:

$$\Delta S_m \approx (\partial S_m/\partial T)_{p,x} \Delta T + (\partial S_m/\partial p)_{T,x} \Delta P + (\partial S_m/\partial x)_{T,x} \Delta x,$$

where the parameters in the partial derivatives, e.g. each coefficient of $(\partial S_m/\partial T)_{p,x}$ and so on, is defined as a temperature coefficient of the solubility and a pressure of the solubility, and a molar ratio coefficient of the mineralizer.

As it results form the above graph presented in FIG. 1, the solubility is an increasing function of pressure and a decreasing function of temperature. On the basis of these dependences it is possible to obtain GaN bulk single crystal by dissolving it under higher solubility conditions and crystallizing under lower solubility conditions. Negative temperature coefficient of solubility means that in the presence of a temperature gradient the chemical transport of nitride occurs from the lower temperature dissolution zone to the higher temperature crystallization zone. Furthermore, it is also found that other gallium compounds and metallic gallium can be used as a supplier for GaN complex.

For example, Ga complex, such as metallic gallium which is the simplest element can be introduced into the above solvent. Next, the supersaturation of solution with respect to nitride is obtained by change of physical conditions such as heating, so that crystal can be grown on a seed. According to the present invention, it is possible to crystallize the desired nitride bulk single crystal on a seed and also to lead the stoichiometric growth of GaN obtained as a bulk single crystal layer on a seed in the form of GaN crystal.

The obtained single crystal may contain alkali metals at the concentration of 0.1 ppm or more since the single crystal is grown in the supercritical ammonia-containing solution containing alkali metal ions. In view of maintaining the desired ammonobasic character of the supercritical solution, and also in order to avoid corrosion of the apparatus, no halogens are intentionally introduced into the supercritical solvent. According to the present invention, intentional replacing of 0.05 to 0.5 Ga by Al or In may be achieved. The crystal lattice constants of the obtained nitride can be adjusted by a appropriate modification of the composition. GaN bulk single crystal obtained by the process according to the present invention may be also intentionally doped with donor dopants (such as Si, O etc.), acceptor dopants (such as Mg, Zn etc.) or magnetic dopants (such as Mn, Cr etc.) in concentrations of $10^{17}$ to $10^{21}/cm^3$. The dopants may change optical, electrical and magnetic properties of nitride. As for other physical properties, the grown GaN bulk single crystal has a surface dislocation density of $10^6/cm^2$ or less, preferably $10^5/cm^2$ or less, more preferably $10^4/cm^2$ or less, and also has the full width at half maximum of the X-ray from the surface (0002) plane of 600 arcsec. or less., preferably 300 arcsec. or less, more preferably 60 arcsec. or less. It is possible to grow a GaN bulk single crystal as the best which has a surface dislocation density of about $10^4/cm^2$ or less, and the full width at half maximum of the X-ray from the surface (0002) of 60 arcsec. or less.

(Temperature difference between the crystallization zone and the dissolution zone)

When two zones, i.e., the dissolution zone and the crystallization zone are simultaneously formed in the autoclave, supersaturation of the supercritical solution with respect to the seed is maintained by controlling the dissolution temperature and the crystallization temperature. The control is found to be easy by setting the temperature of the crystallization zone at 400 to 600° C., and by maintaining the difference in temperature between the dissolution zone and the crystallization zone within the autoclave, at 150° C. or less, preferably 100° C. or less. Preferably, the adjustment of the supersaturation of the supercritical solution with respect to the seed is made by providing at least one baffle for dividing the internal of the autoclave into a lower temperature dissolution zone and a higher temperature crystallization zone, and controlling the convection flow between the dissolution zone and the crystallization zone. Further, when two zones, i.e., a dissolution zone and a crystallization zone, between which a specified temperature difference is set, are formed in the autoclave, the supersaturation of the supercritical solution with respect to the seed is preferably adjusted by using an gallium-containing feedstock composed of an GaN crystal having a total surface area larger than the total surface area of the seed.

The present invention relates to a technique of an ammono-basic growth of a crystal which comprises the steps of causing a chemical transport in a supercritical ammonia-containing solvent containing at least one mineralizer for imparting an ammono-basic property, thereby growing a nitride single crystal. The terms herein should be understood as having the meanings defined as below in the present specification.

(Nitride)

The term "nitride" in the specification means a compound which includes at least nitrogen atom as a consistent element, defined as the general formula $Al_xGa_{1-x-y}In_yN$, where $0 \leq x \leq 1$, $0 \leq y \leq 1$, and $0 \leq x+y \leq 1$, and may contain at least the binary compound such as GaN or AlN, ternary compounds such as AlGaN, InGaN or also quaternary compounds AlInGaN. It is preferable that $Al_xGa_{1-x}N$, where $0 \leq x \leq 1$, is used and it may contain a donor, an acceptor, or a magnetic dopant, as required. The term "nitride bulk single crystal" means a nitride single crystal substrate on which an optical and electronic device such as LED or LD can be formed by an epitaxial growing process, such as MOCVD, HVPE or the like.

(Precursor)

The term "a precursor of nitride" means a substance which may contain at least gallium or aluminum, and if needed, an alkali metal, an element of the Group XIII, nitrogen and/or hydrogen, or a mixture thereof, and examples of such a precursor include metallic Ga or Al, an alloy or an intermetallic compound of Ga or Al, and a hydride, amide, imide, amido-imide or azide of Ga or Al, which can form a gallium compound or aluminum compound soluble in a supercritical ammonia-containing solvent as defined below.

(Feedstock)

The term "feedstock" means a gallium-containing nitride, aluminum-containing nitride or a precursor thereof. The process of the present invention is based on an ammono-basic reaction. The feedstock may be GaN or AlN formed by HVPE, or GaN or AlN formed by chemical reactions, which originally may contain chlorine, in so far as the ammono-basic supercritical reaction is not hindered. A combination of nitride which is dissolved in an equilibrium reaction to the supercritical ammonia-containing solvent and metallic gallium or metallic aluminum which irreversibly reacts with the supercritical ammonia-containing solvent can be used as a feedstock.

The control of the reaction for crystallization becomes easy by making use of gallium nitride as the nitride. In this case, GaN single crystal is preferably used as a seed. GaN obtained by flux method or polycrystalline gallium nitride poly-crystallized from the supercritical ammonia of metallic Ga can be used as a feedstock for GaN.

(Supercritical ammonia-containing solvent)

In the present invention the supercritical solvent may contain $NH_3$ or a derivative thereof. The mineralizer may contain alkali metal ions, at least, ions of sodium or potassium. The term "supercritical ammonia-containing solvent" means a supercritical solvent which may contain at least ammonia, and ion or ions of at least one alkali metal for dissolving nitride.

(Mineralizer)

The term "mineralizer" means a supplier for supplying one or more of alkali metal ions for dissolving nitride in the supercritical ammonia-containing solvent. Mineralizer is introduced in the form of alkali metal compound for imparting alkali metal or alkali metal ions in the supercritical ammonia-containing solvent. In the view of the purity, it is preferable that the mineralizer in the form of alkali metallic azide ($NaN_3$, $KN_3$, $LiN_3$) or alkali metal (Na, K, Li) may be introduced, however, alkali metal amide can be simultaneously used, as required. The concentration of alkali metal ions in the supercritical solvent is adjusted so as to ensure the specified solubilities of feedstock or nitride, and the molar ratio of the alkali metal ions to other components of the resultant supercritical solution is controlled within a range from 1:200 to 1:2, preferably from 1:100 to 1:5, more preferably from 1:20 to 1:8. In case of using the combination of two or more elements of alkali metal ions, the rate of crystal growth and crystal quality can be improved more, compared with the case where only one element of alkali metal ion is used. Moreover an alkaline earth metal, such as Mg, Zn or Cd, can be simultaneously used, as required. Furthermore, neutral element (alkali metal halide), acidic element (ammonium halide) may be simultaneously used, in so far as the ammono-basic supercritical reaction is not hindered.

(Dissolution of feedstock)

Dissolution of feedstock is a reversible or irreversible process where the feedstock is in the form of nitride compound soluble in the supercritical solvent, for example gallium complex compound or aluminum complex compound. Gallium complex compound is chemical complex compound, in which a centrally placed gallium atom is surrounded by $NH_3$ type ligands or their derivatives, such as $NH_2^-$, $NH^{2-}$.

(Supercritical ammonia-containing solution)

The term "supercritical ammonia-containing solution" means a soluble gallium or aluminum compounds formed by the dissolution of the feedstock in the supercritical ammonia-containing solvent. Based on our experiment, we have found that there is an equilibrium relationship between the metallic nitride solid and the supercritical solution under sufficiently high temperature and pressure conditions. Accordingly, the solubility of the soluble nitride can be defined as the equilibrium concentration of the above soluble gallium or aluminum compounds in the presence of solid nitride. In such a process, it is possible to shift this equilibrium by changing temperature and/or pressure.

(Solubility)

Figure 2:
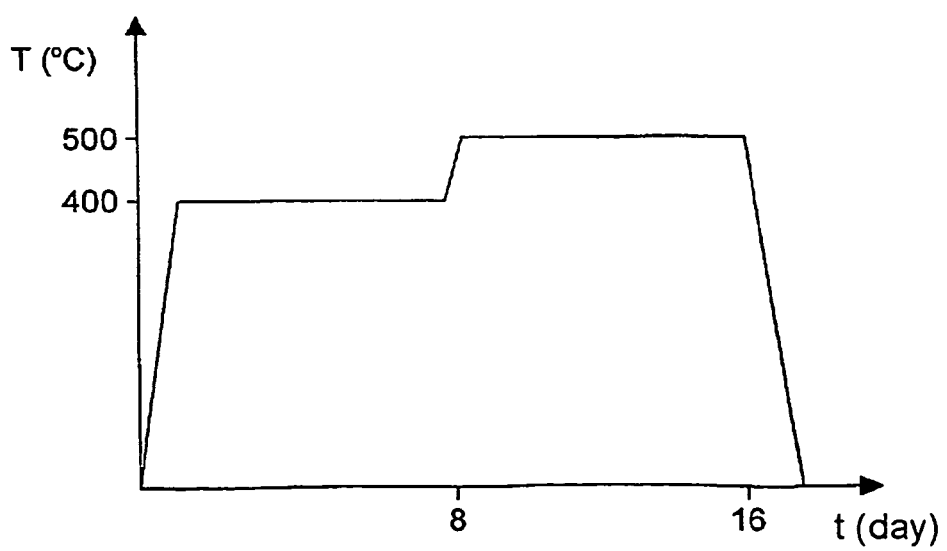
FIG. 2 shows a graph illustrating a relation of change in temperature in an autoclave with the passage of time and change between a dissolution step and a crystallization step, where the pressure is kept constant.
Figure 3:
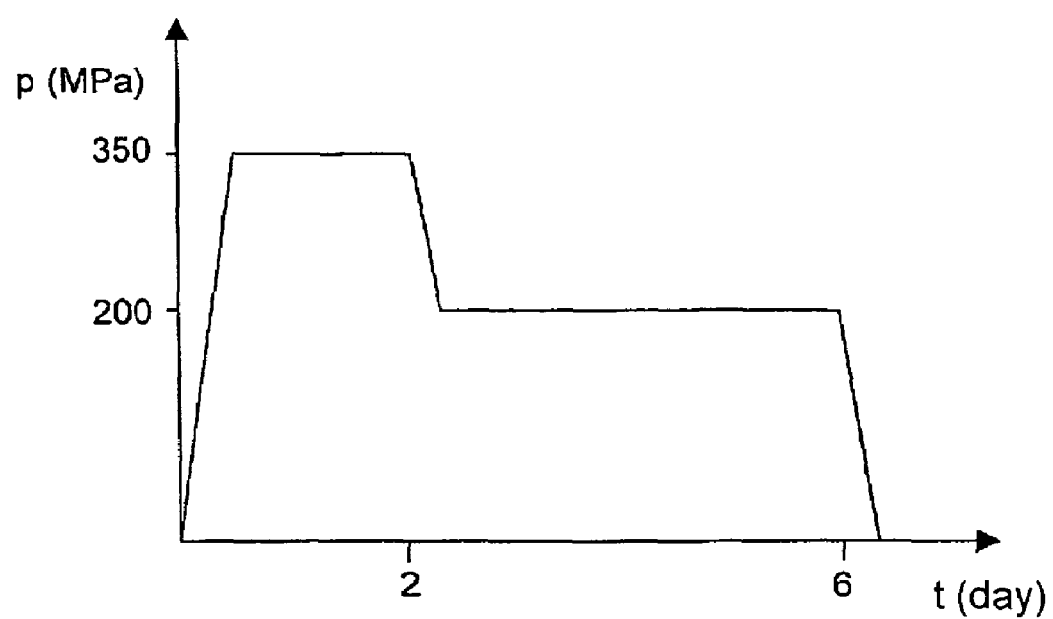
FIG. 3 shows a graph illustrating a relation of change in pressure in an autoclave with the passage of time and change between a dissolution step and a crystallization step, where the temperature is kept constant.

The phrase "negative temperature coefficient of solubility" means that the solubility is expressed by a monotonically decreasing function of the temperature, when all other parameters are kept constant. Similarly, the phrase "positive pressure coefficient of solubility" means that the solubility is expressed by a monotonically increasing function of the pressure, when all other parameters are kept constant. Based on our research, the solubility of nitride in the supercritical ammonia-containing solvent, has a negative temperature coefficient within a range of 300 to 550° C., and a positive pressure coefficient within the range of 1 to 5.5 kbar. For example, as shown in FIG. 2, after dissolution of feedstock in an autoclave kept for 8 days at the temperature 400° C. (i.e. after dissolution step), crystallization of gallium nitride may be achieved by increasing the temperature inside the autoclave to 500° C. (crystallization step). On the other hand, as shown in FIG. 3, after dissolution of a feedstock at increased pressure in an autoclave kept for 2 days at the level of 3.5 kbar (i.e. after dissolution step), crystallization of gallium nitride is achieved by means of reducing the pressure to 2 kbar in the autoclave (crystallization step).

(Supersaturation)

The phrase "supersaturation of the supercritical ammonia-containing solution with respect to the nitride" means that the concentration of the soluble gallium or aluminum compounds in the above supercritical ammonia-containing solution is higher than the concentration in the equilibrium state, i.e., the solubility of nitride. In case of the dissolution of nitride in a closed system, such supersaturation can be achieved, according to the negative temperature coefficient or the positive pressure coefficient of solubility, by raising the temperature or reducing the pressure.

(Chemical transport)

The phrase "the chemical transport of nitride in the supercritical ammonia-containing solution" means a sequential process including the dissolution of the feedstock, the transfer of the soluble nitride through the supercritical ammonia-containing solution, and the crystallization of nitride from the supersaturated supercritical ammonia-containing solution. In general, a chemical transport process is carried out by a certain driving force such as a temperature gradient, a pressure gradient, a concentration gradient, difference in chemical or physical properties between the dissolved feedstock and the crystallized product, or the like. Preferably, the chemical transport in the process of the present invention is achieved by carrying out the dissolution step and the crystallization step in separate zones, provided that the temperature of the crystallization zone is maintained higher than that of the dissolution zone so that the nitride bulk single crystal can be obtained by the processes of this invention.

(Seed)

The term "seed" has been described by way of examples in the present specification. The seed provides a region or area on which the crystallization of nitride is allowed to take place and the growth quality of the crystal depends on the quality of the seed. Thus, the seed of high quality should be selected. The dislocation density thereof is preferably $10^5/cm^2$ or less. As a seed, a natural seed obtained from flux method or high pressure method, A-plane, M-plane or R-plane seed obtained by bulk single crystal can also be used. Moreover, a seed having a seed surface exhibiting n-type electrical conductivity doped with Si may be used.

Such seed can be produced using processes for nitride crystal growth from gaseous phase, such as HVPE or MOCVD, etc. Doping with Si during the growth process at the level of $10^{16}$ to $10^{21}$/cm$^2$ ensures n-type electric conductivity. Moreover, a composite seed obtained by growing AlN or GaN deposited on the electric conductive substrate of SiC, etc. may be used.

(Spontaneous crystallization)

The term "spontaneous crystallization" means an undesirable phenomenon in which the formation and the growth of the core of nitride from the supersaturated supercritical ammonia-containing solution occur at any site inside the autoclave, and the spontaneous crystallization also includes disoriented growth of the crystal on the surface of the seed.

(Selective crystallization)

The term "selective crystallization on the seed" means a step of allowing the crystallization to take place on the surface of the seed, accompanied by substantially no spontaneous growth. This selective crystallization on the seed is essential for the growth of a bulk single crystal, and it is one of the elements of the present invention.

(Feedstock)

Pellets to be used in the present invention are prepared by molding the powder and baking them so that its density is 70% or more. Higher density is preferable.

(Temperature and pressure of the reaction)

The temperature distribution in the autoclave as will be described later in the part of Example is determined by using an empty autoclave inside, i.e. without the supercritical ammonia, and thus, the supercritical temperature is not the one actually measured. On the other hand, the pressure in the autoclave is directly measured, or it is determined by the calculation from the amount of ammonia introduced initially, the temperature and the volume of the autoclave.

(Example)

High-pressure autoclave 1 (FIG. 9), having the inner diameter of 40 mm, length equal to 480 mm (D/L=1/12) and volume of 585 cm$^3$, is charged with 30 g of feedstock in the form of GaN in the crucible in the dissolution zone 13, and GaN seed of the diameter of 1 inchΦ obtained by HVPE method is placed in the crystallization zone 14 of the same autoclave. Next the autoclave 1 is filled with 1.2 g of 6N purity metallic gallium, 23 g of 3N purity metallic sodium as a mineralizer and 238 g of ammonia (5N) and then closed. The autoclave 1 is introduced into the furnace unit 4 and heated to 200° C. for three days.

Figure 6:
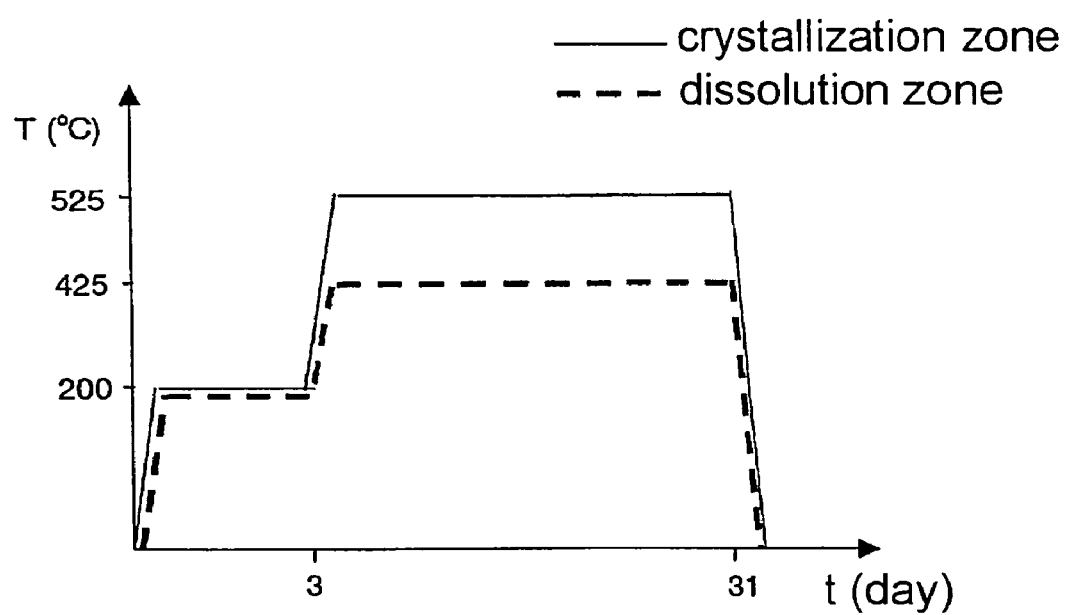
FIG. 6 shows a graph illustrating change in temperature in an autoclave with the passage of time and a relation of change in a dissolution step and a crystallization step in Example.

Then the temperature in the dissolution zone 13 of the autoclave is increased to 425° C., while the temperature in the crystallization zone 14 is increased to 525° C. The resultant pressure within the autoclave is 2.5 kbar. The autoclave is left under such condition for another twenty eight days. (FIG. 6) As a result of the processes, partial dissolution of the feedstock in the dissolution zone 13 and growth of gallium nitride on the HVPE-GaN seed in the crystallization zone 14 are observed. The total thickness of the both sides of single crystal layer is about 3 mm.

The processes described below are carried out so as to use the resultant crystal as a substrate.

1) A single crystal layer of 3 mm thick deposited on a HVPE-GaN seed is put into a furnace and annealed for 1 to 5 hours in the nitrogen atmosphere, containing low amount of oxygen, at temperature from 600° C. to 900° C.

2) The sample is placed into the wire saw manufactured by Takatori Corp. The sample is positioned with the off-angle about 1 degree or less. Then the sample is sliced by diamond slurry, so that 5 slices with the off-angle between 0.05 and 0.2 degree are obtained.

3) The sliced samples are put once more into a furnace and annealed again for 1 to 5 hours in the nitrogen atmosphere, containing low amount of oxygen, at temperature from 600° C. to 900° C. (The thus prepared sample is called GaN substrate.)

4) The GaN substrate is adhered by adhesive agent on the block for polishing, the block is placed on a polishing machine manufactured by Logitech Ltd. and the GaN substrate is polished consecutively on each side. In the polishing process, diamond slurry and colloidal silica with pH from 3 to 6 or alumina solution with pH from 9 to 11 are used. The roughness of the obtained surface is 10 Å or less.

5) Next, a cap layer of less than several μm in the form of GaN or AlGaN is formed on the surface of GaN substrate by HVPE method, under the condition as follows, so that a template is obtained.

6) In the next step, on a GaN substrate with the above mentioned cap layer or on a GaN substrate without the cap layer, another GaN layer of 3 mm thick is formed by HVPE method. After cutting and polishing according to the aforementioned procedures the template having the thickness about 0.5 mm, suitable for light emitting devices, is obtained.

HVPE condition: reaction temperature: 1050° C.,
reaction pressure: atmospheric pressure,
partial pressure of ammonia: 0.3 atm,
partial pressure of GaCl: $1\times10^{-3}$ atm
hydrogen carrier gas As required, 7) After polishing, the GaN substrate is kept in the supercritical ammonia without mineralizer for 1 day at 200° C. and then the impurity on the surface of the GaN substrate is removed.

INDUSTRIAL APPLICABILITY

High quality nitride bulk single crystal can be obtained from a supercritical ammonia-containing solution.

The invention claimed is:

1. An apparatus for obtaining a bulk single crystal comprising an autoclave for preparing a supercritical solvent equipped with a convection control means for establishing a convection flow, and mounted inside a furnace unit equipped with a heating device and a cooling device,
   wherein the furnace unit is controlled to obtain a temperature gradient within said autoclave by said heating device and/or cooling device,
   wherein the convection control means comprises at least one horizontal baffle having a central opening and/or a space between the baffle and an inner wall of the autoclave, and separating the dissolution zone where a feedstock is located above said baffle from said crystallization zone where a seed is located below said baffle,
   wherein nitride is dissolved in the supercritical solvent containing ammonia and at least alkali metal ions to make the supercritical solution, in which the nitride has a negative temperature coefficient of solubility and the supercritical solution is supplied from said dissolution zone to said crystallization zone in which a seed is located through said convection control means so that nitride crystal is grown on the seed arranged in the autoclave,
   wherein a lining of metal such as Ag, Mo, Fe or Ta, or alloy thereof is applied to an inner wall of the autoclave.

2. The apparatus for obtaining a bulk single crystal according to claim 1, wherein the cooling device is placed so as to cool an area where said convection control means is located, thereby to provide the temperature difference between said dissolution zone and said crystallization zone.

3. The apparatus for obtaining a bulk single crystal according to claim 1, wherein the cooling device which can cool the bottom of the flowing area of said crystallization zone is placed in the autoclave and thereby rapid cooling function is operated after crystallization.

4. The autoclave according to claim 1, wherein said convection control means is located within the range from $1/3$ to $2/3$ of the total length of the inner autoclave in a longitudinal direction, to thereby adjust the ratio between said dissolution zone and said crystallization zone to a desirable value.

5. The autoclave according to claim 1, wherein the ratio of a diameter of the autoclave in a direction perpendicular to a longitudinal direction relative to a total length of the autoclave is set from $1/15$ to $7/15$, the ratio of opening in said horizontal baffle on the cross-sectional area is set at 30% or less and a growth rate on a seed is 10 μm/hr or more.

6. The autoclave for obtaining a bulk single crystal according to claim 1, wherein a convection flow rate of the supercritical solution between said dissolution zone and said crystallization zone is determined by a degree of opening of said convection control means and a temperature difference between said dissolution zone and said crystallization zone.

7. An apparatus for obtaining a bulk single crystal comprising an autoclave for preparing a supercritical solvent equipped with a convection control means for establishing a convection flow, and mounted inside a furnace unit equipped with a heating device and a cooling device, wherein the furnace unit is controlled to obtain a temperature gradient within said autoclave by said heating device and/or cooling device, wherein the convection control means comprises at least one horizontal baffle having a central opening and/or a space between the baffle and an inner wall of the autoclave, and separating the dissolution zone where a feedstock is located above said baffle from said crystallization zone where a seed is located below said baffle, wherein nitride is dissolved in the supercritical solvent containing ammonia and at least alkali metal ions to make the supercritical solution, in which the nitride has a negative temperature coefficient of solubility and the supercritical solution is supplied from said dissolution zone to said crystallization zone in which a seed is located through said convection control means so that nitride crystal is grown on the seed arranged in the autoclave, wherein the feedstock made of gallium metal is placed in said dissolution zone and the filling ratio of the feedstock is less than half of said dissolution zone.

8. The autoclave for obtaining a bulk single crystal according to claim 7, wherein a convection flow rate of the supercritical solution between said dissolution zone and said crystallization zone is determined by a degree of opening of said convection control means and a temperature difference between said dissolution zone and said crystallization zone.

* * * * *